(12) United States Patent
Takei et al.

(10) Patent No.: US 11,379,210 B2
(45) Date of Patent: Jul. 5, 2022

(54) CIRCUIT BOARD AND METHOD FOR DELIVERING PROGRAM TO PLURALITY OF CIRCUIT BOARDS

(71) Applicant: FUJIFILM Business Innovation Corp., Tokyo (JP)

(72) Inventors: Masaaki Takei, Kanagawa (JP); Yujiro Kobayashi, Kanagawa (JP); Nobuyuki Obayashi, Kanagawa (JP); Kenji Nomura, Kanagawa (JP); Mamoru Sasamae, Kanagawa (JP); Masaki Kurokawa, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 342 days.

(21) Appl. No.: 16/531,124

(22) Filed: Aug. 5, 2019

(65) Prior Publication Data

US 2020/0057624 A1 Feb. 20, 2020

(30) Foreign Application Priority Data

Aug. 14, 2018 (JP) .............................. JP2018-152602

(51) Int. Cl.
| | |
|---|---|
| *G06F 8/65* | (2018.01) |
| *G06F 8/70* | (2018.01) |
| *G06F 13/16* | (2006.01) |
| *G01R 31/302* | (2006.01) |

(52) U.S. Cl.
CPC ................. *G06F 8/65* (2013.01); *G06F 8/70* (2013.01); *G06F 13/1668* (2013.01); *G01R 31/3025* (2013.01)

(58) Field of Classification Search
CPC ... G01R 31/3025; G06F 13/1668; G06F 8/65; G06F 8/654; G06F 8/70
See application file for complete search history.

(56) References Cited

U.S. PATENT DOCUMENTS

| | | | | |
|---|---|---|---|---|
| 2009/0094408 A1* | 4/2009 | Osaka | .................... | G06F 8/654 |
| | | | | 711/E12.008 |
| 2011/0179211 A1* | 7/2011 | Li | .............................. | G06F 8/65 |
| | | | | 711/E12.001 |
| 2013/0198732 A1* | 8/2013 | Fujita | ....................... | G06F 8/65 |
| | | | | 717/170 |

FOREIGN PATENT DOCUMENTS

| | | |
|---|---|---|
| JP | 2002182939 | 6/2002 |
| JP | 2004348178 | 12/2004 |
| JP | 2012088767 | 5/2012 |

* cited by examiner

*Primary Examiner* — Terrell S Johnson
(74) *Attorney, Agent, or Firm* — JCIPRNET

(57) ABSTRACT

A circuit board incorporable into an apparatus includes a substrate, a reception unit that is provided on the substrate and that wirelessly receives a function program for achieving a function, a storage unit that is provided on the substrate and to which a writing program for writing the function program received by the reception unit has been written in advance, a power supply provided on the substrate, and a power control unit that supplies power for receiving, with the reception unit, the function program and power for writing, on a basis of the writing program, the function program to the storage unit using the power supply without using an external power supply.

11 Claims, 5 Drawing Sheets

CIRCUIT BOARD AND METHOD FOR DELIVERING PROGRAM TO PLURALITY OF CIRCUIT BOARDS

CROSS-REFERENCE TO RELATED APPLICATIONS

This application is based on and claims priority under 35 USC 119 from Japanese Patent Application No. 2018-152602 filed Aug. 14, 2018.

BACKGROUND

(i) Technical Field

The present disclosure relates to a circuit board and a method for delivering a program to a plurality of circuit boards.

(ii) Related Art

In Japanese Unexamined Patent Application Publication No. 2002-182939, a method for writing data to a memory is disclosed. The method includes a first process in which a first communication unit whose data transfer speed is relatively low is set to a state in which the first communication unit can transfer data, a second process in which, after the state is set, a first communication unit transfers, to a memory device, a program for activating a second communication unit whose data transfer speed is higher than that of the first communication unit, and a third process in which the second communication unit is operated using the program stored in the memory device and a writing unit writes, to the memory device, data to be written to the memory device.

In Japanese Unexamined Patent Application Publication No. 2004-348178, a method for writing, during fabrication of an electronic apparatus that controls a control target apparatus in accordance with a control program, the control program to a storage unit of the electronic apparatus is disclosed. The method includes storing, in the storage unit, an inspection program for sequentially checking whether the control target apparatus controlled by the electronic apparatus can perform a plurality of certain operations in accordance with an instruction from the electronic apparatus and a writing program for writing the control program to the storage unit, sequentially inspecting, in accordance with inspection order specified by the inspection program, the control target apparatus in terms of the plurality of certain operations by executing an operation program stored in the storage unit each time inspection preparation for one of the plurality of certain operations of the control target apparatus is completed, and writing the control program to the storage unit by executing the writing program during the inspection preparation in the sequentially inspecting.

In Japanese Unexamined Patent Application Publication No. 2012-088767, a method for updating a program incorporated into an electronic apparatus including electronic components is disclosed. The method includes obtaining common update data, which is part of update data for the program shared by a plurality of electronic apparatuses including electronic components of different types and models, collectively obtaining differential data between the common update data and update data for the program to be used for each of the plurality of electronic apparatuses, obtaining update procedure data that specifies a procedure for updating the program using the common update data and the differential data, obtaining types and models of the electronic components, and updating the program in accordance with the procedure specified by the update procedure data using the types and models of the electronic components obtained in the obtaining types and models of the electronic components, the common update data, and the differential data.

SUMMARY

Programs are often written to storage units included in circuit boards. If programs are written before circuit boards are incorporated into apparatuses, the circuit boards need to be set in a jig one by one, and the programs need to be written using a power supply of the jig, which takes time.

If programs are written after circuit boards are incorporated into apparatuses, the programs need to be written using power supplies provided for the apparatuses, and it takes time to activate the power supplies of the apparatuses.

Aspects of non-limiting embodiments of the present disclosure relate to a circuit board that allows a program to be written to a storage unit thereof without using an external power supply of a jig, an apparatus, or the like and a method for delivering a program to a plurality of substrates.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a circuit board incorporable into an apparatus. The circuit board includes a substrate, a reception unit that is provided on the substrate and that wirelessly receives a function program for achieving a function, a storage unit that is provided on the substrate and to which a writing program for writing the function program received by the reception unit has been written in advance, a power supply provided on the substrate, and a power control unit that supplies power for receiving, with the reception unit, the function program and power for writing, on a basis of the writing program, the function program to the storage unit using the power supply without using an external power supply.

BRIEF DESCRIPTION OF THE DRAWINGS

An exemplary embodiment of the present disclosure will be described in detail based on the following figures, wherein.

DETAILED DESCRIPTION

Figure 1:
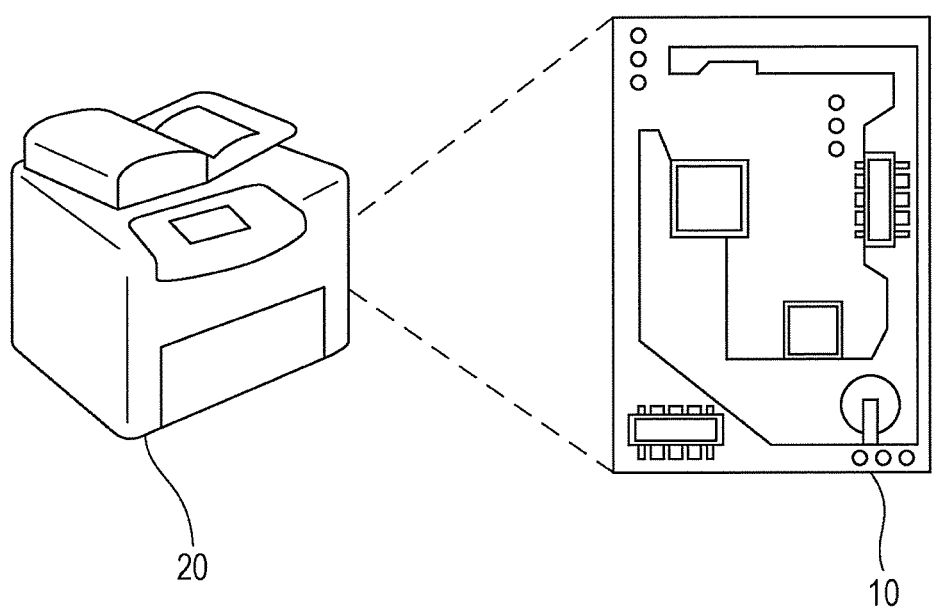
FIG. 1 is a diagram illustrating a circuit board according to an exemplary embodiment of the present disclosure.

An exemplary embodiment of the techniques in the present disclosure will be describe hereinafter with reference to the drawings. In the drawings, the same or equivalent components or parts are given the same reference numerals. Dimensional ratios in the drawings are exaggerated for convenience of description and might be different from actual ones.

FIG. 1 is a diagram illustrating a circuit board according to the exemplary embodiment of the present disclosure.

As illustrated in FIG. 1, a circuit board 10 can be incorporated into an apparatus 20 and, after the incorporation, controls the apparatus 20. The apparatus 20 may be any type of apparatus into which a circuit board can be incorporated. The circuit board 10 includes a substrate 11 and is fabricated by mounting various components, such as a central processing unit (CPU), on the substrate 11 and connecting the components to one another through wiring.

The hardware configuration of the circuit board 10 will be described.

Figure 2:
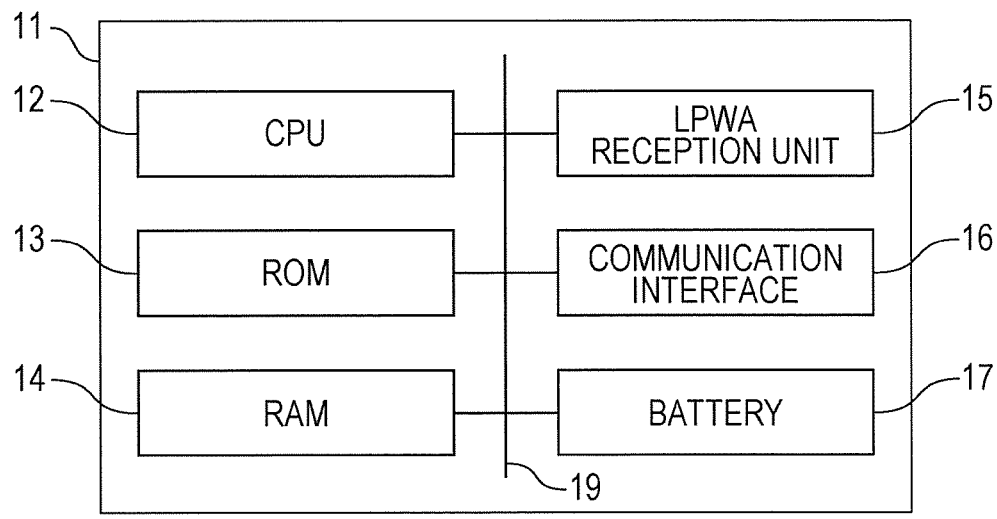
FIG. 2 is a block diagram illustrating the hardware configuration of the circuit board.

FIG. 2 is a block diagram illustrating the hardware configuration of the circuit board 10.

As illustrated in FIG. 2, the circuit board 10 includes the substrate 11, a CPU 12, a ROM 13, a random-access memory (RAM) 14, a low-power wide-area (LPWA) reception unit 15, a communication interface 16, and a battery 17. The CPU 12, the ROM 13, the RAM 14, the communication interface 16, and the battery 17 are communicably connected to one another through a bus 19. The circuit board 10 may include a flash memory or the like instead of, or in addition to, the ROM 13.

The substrate 11 is an insulating board on or in which conductive wiring is provided. Electronic devices such as the CPU 12, the ROM 13, the RAM 14, the LPWA reception unit 15, the communication interface 16, and the battery 17 are mounted on the substrate 11.

The CPU 12 executes various programs and controls the other components. That is, for example, the CPU 12 reads a program (firmware) from the ROM 13 and executes the program using the RAM 14 as a working area. The CPU 12 controls the other components and performs various types of arithmetic processing in accordance with programs stored in the ROM 13. In the present exemplary embodiment, the CPU 12, as a power control unit, writes various pieces of firmware to the ROM 13 and supplies, using only the battery 17, power for deletion to the ROM 13 and the LPWA reception unit 15, which will be described later.

The ROM 13, as a storage unit, stores various pieces of firmware (programs) and data. The RAM 14 temporarily stores a program or data as a working area.

The LPWA reception unit 15 is a receiver that wirelessly receives data using an LPWA technique. The LPWA reception unit 15 is capable of wirelessly transmitting data using the LPWA technique.

The communication interface 16 is used to communicate with another apparatus such as a firmware writing apparatus, which will be described later, and employs a standard such as Ethernet, fiber distributed data interface (FDDI), or Wi-Fi (registered trademark).

The battery 17 supplies, as a power supply, power for the CPU 12 to perform operations. The battery 17 is, for example, a coin-shaped cell. When firmware is received using the LPWA technique, the battery 17 supplies power to the ROM 13 and the LPWA reception unit 15. As a result, the battery 17 achieves the communication based on the LPWA technique and the writing to and updating of the ROM 13 even if no power is supplied from any power supply other than the battery 17.

When the circuit board 10 is fabricated and inspected and the apparatus 20 is manufactured, various pieces of firmware are written to or deleted from the circuit board 10. These processes will be described in detail hereinafter.

Fabrication of Circuit Board 10

Figure 3:
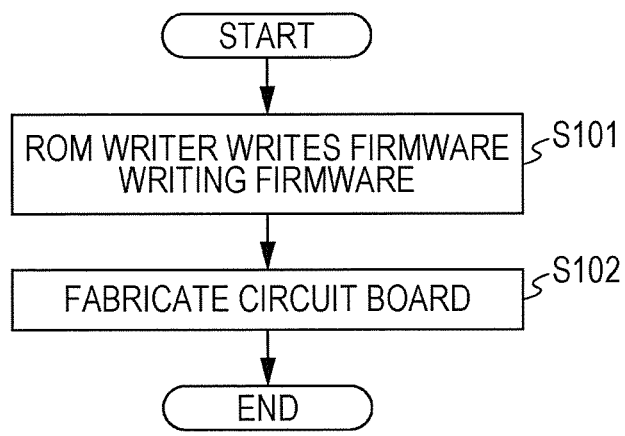
FIG. 3 is a flowchart illustrating a process in fabrication of the circuit board.
Figure 4:
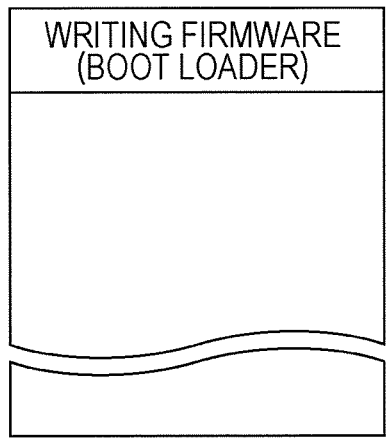
FIG. 4 is a diagram illustrating firmware stored in a read-only memory (ROM) during the fabrication of the circuit board.

FIG. 3 is a flowchart illustrating a process in the fabrication of the circuit board 10. FIG. 4 is a diagram illustrating firmware stored in the ROM 13 during the fabrication of the circuit board 10.

In the fabrication of the circuit board 10, first, the substrate 11 on which at least the ROM 13 is mounted is prepared. The substrate 11 is then set in a dedicated jig by wire, and a ROM writer writes firmware (writing program: boot loader) for writing firmware to the ROM 13 (step S101). The writing firmware may be simultaneously written to a plurality of circuit boards 10. After the writing of the firmware is completed, the circuit board 10 is removed from the jig.

Next, various electronic devices are mounted on the substrate 11 to fabricate the circuit board 10 (step S102). After step S102 ends, the circuit board 10 has at least the hardware configuration illustrated in FIG. 2.

As illustrated in FIG. 4, as a result of the writing in step S101, the writing firmware is stored in the ROM 13.

The fabricated circuit board 10 is then subjected to the inspection. The inspection of the circuit board 10 may be performed, for example, at a place (factory) different from one used to fabricate the circuit board 10. In the fabrication of the circuit board 10, therefore, it is sufficient if the writing firmware has been developed. In other words, in the fabrication of the circuit board 10, an inspection program and control firmware relating to the operation of the apparatus 20, which will be described later, are not necessary and need not be developed at this stage. A program developer, therefore, may develop programs flexibly in accordance with the progress of the processes.

Inspection of Circuit Board 10

Figure 5:
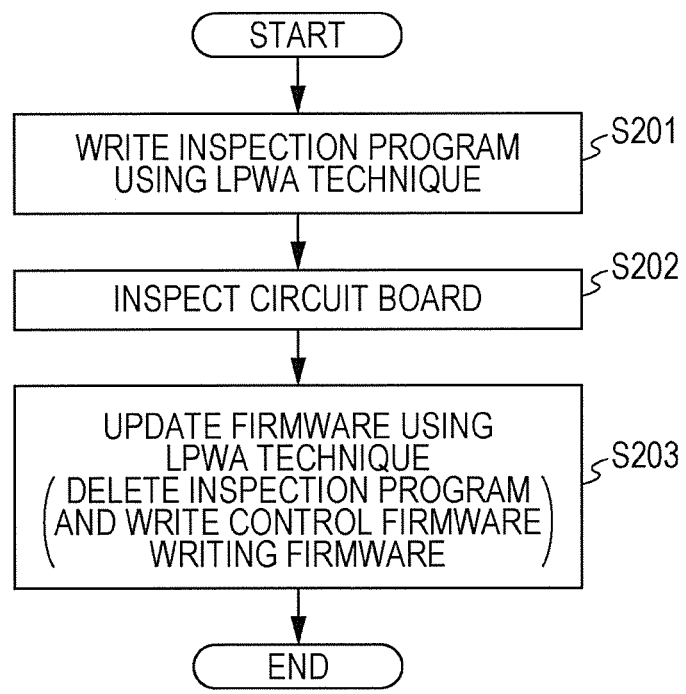
FIG. 5 is a flowchart illustrating a process in inspection of the circuit board.
Figure 6:
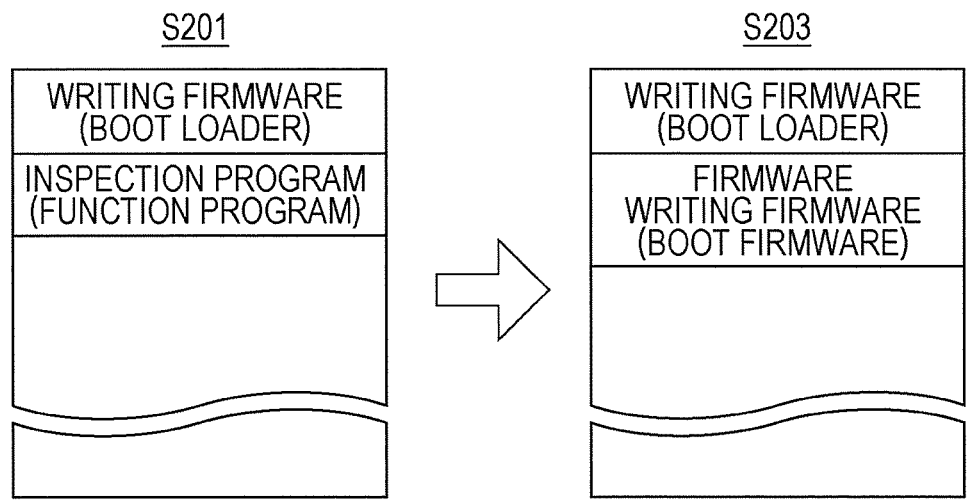
FIG. 6 is a diagram illustrating firmware stored in the ROM during the inspection of the circuit board.

FIG. 5 is a flowchart illustrating a process in the inspection of the circuit board 10. FIG. 6 is a diagram illustrating firmware stored in the ROM 13 during the inspection of the circuit board 10.

In the inspection of the circuit board 10, first, the writing firmware writes an inspection program (function test program) as a function program for achieving functions other than ones achieved by the writing firmware (step S201). The inspection program is a shipment inspection program for checking whether the electronic devices on the circuit board 10 operate normally. The inspection program is written wirelessly using the LPWA technique. The inspection program may be simultaneously written to a plurality of circuit boards 10.

The circuit board 10 is inspected in accordance with the written inspection program (step S202). Here, the CPU 12 sequentially operates the electronic devices on the substrate 11 in accordance with the inspection program and determines, on the basis of responses obtained in the operations, whether the electronic devices operate normally. Results of the determinations may be transmitted to an inspection apparatus or the like, which is not illustrated, and reported to an operator.

After the inspection is completed, firmware is updated (step S203). More specifically, the inspection program is deleted from the ROM 13, and control firmware writing firmware for writing the control firmware to the ROM 13 in a later process is written to the ROM 13 as a function program. The inspection program is deleted from the ROM 13 in accordance with an instruction wirelessly transmitted using the LPWA technique. The firmware is wirelessly transmitted using the LPWA technique and received by the LPWA reception unit 15 for updating. The inspection program need not necessarily be deleted from the ROM 13.

As a result of the updating of the firmware in step S203, the circuit board 10 is completed and becomes ready for shipment.

The inspection program and the control firmware writing firmware written in steps S201 and S203, respectively, are function programs, and the amount of data of these pieces of firmware is smaller than that of the control firmware, which is a program for controlling the apparatus 20. The inspection program and the control firmware writing firmware may therefore be transferred through communication based on the LPWA technique, whose transfer speed is lower than in wired transmission. If the writing of the inspection program in step S201 is performed in a waiting period before the inspection, for example, the writing of the inspection program is completed before a beginning of the inspection without the operator being aware of writing time. Similarly, if the updating of the firmware in step S203 is performed in a waiting period before the shipment of the circuit board 10, the updating of the firmware is completed before a beginning of the shipment without the operator being aware of the updating of the firmware. In addition, since the wireless LPWA technique is employed, for example, the firmware may be updated even if a plurality of circuit boards 10 have been packed up for the shipment.

As illustrated in FIG. 6, as a result of the writing in step S201, the inspection program is written to the ROM 13. Furthermore, as a result of the updating in step S203, the inspection program is deleted from the ROM 13 and the firmware writing firmware is written to the ROM 13.

Figure 7:
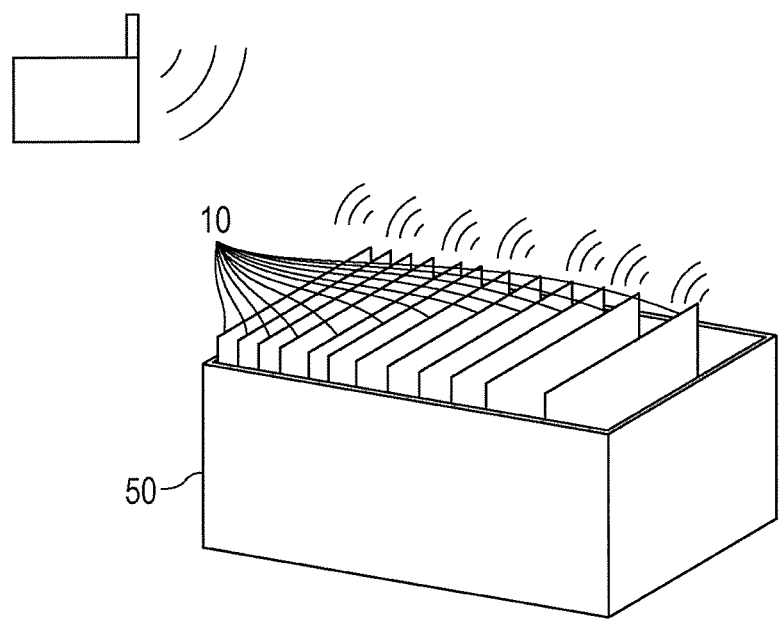
FIG. 7 is a diagram illustrating simultaneous writing to circuit boards.

FIG. 7 is a diagram illustrating simultaneous writing to circuit boards 10.

During inspection, the circuit boards 10 are held by dedicated fabrication jigs one by one or in units of several boards. In other cases, the circuit boards 10 are stored in a box 50 illustrated in FIG. 7. The box 50 stores the circuit boards 10 such that the circuit boards 10 do not come into contact with one another.

In the box 50, the circuit boards 10 wirelessly communicate with a firmware updating (writing) apparatus 60 using the LPWA technique. As a result of the wireless communication, the writing in step S201 and the updating in step S203 are simultaneously performed on all the circuit boards 10 in the box 50. In other words, the firmware updating apparatus 60 simultaneously transmits a function program to the communication interfaces 16 of the circuit boards 10. The circuit boards 10 can receive firmware using the LPWA technique even if the circuit boards 10 are not stored in the box 50. For example, the updating of firmware and other operations may be performed even if the circuit boards 10 have been packed up for shipment.

Manufacture of Apparatus 20

Figure 8:
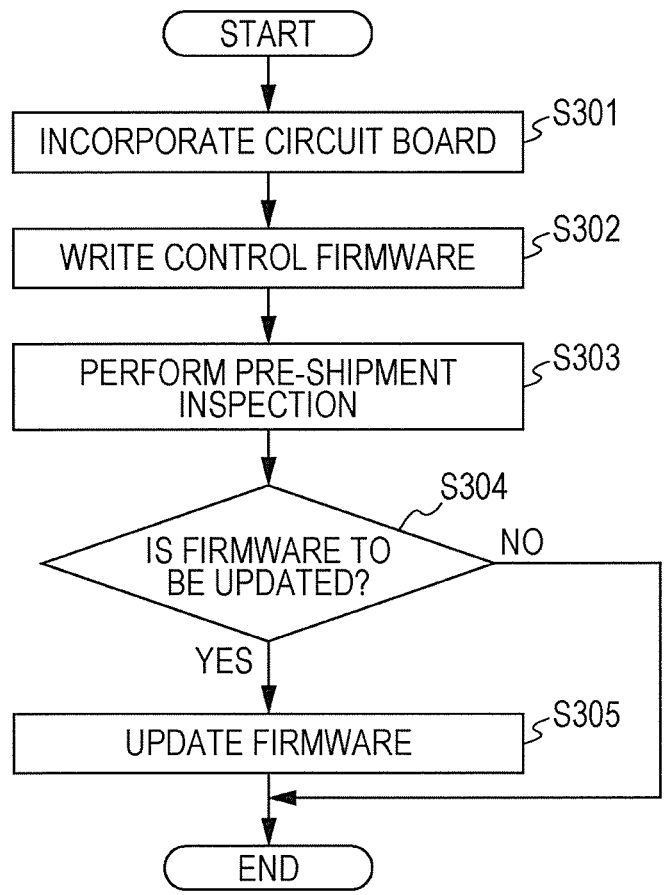
FIG. 8 is a flowchart illustrating a process in manufacture of an apparatus.
Figure 9:
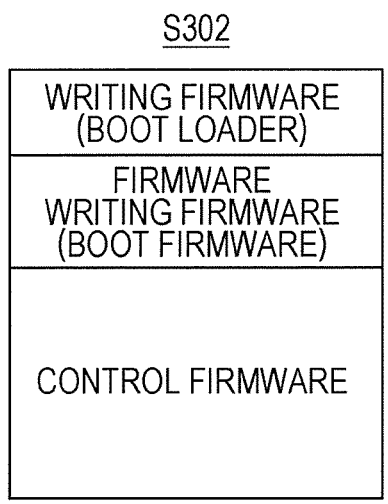
FIG. 9 is a diagram illustrating firmware stored in the ROM during the manufacture of the apparatus.

FIG. 8 is a flowchart illustrating a process in the manufacture of the apparatus 20. FIG. 9 is a diagram illustrating firmware stored in the ROM 13 during the manufacture of the apparatus 20.

In the manufacture of the apparatus 20, the circuit board 10 is incorporated into the apparatus 20 or the like (step S301).

The circuit board 10 incorporated into the apparatus 20 is set in a certain jig, and the writing firmware writes the control firmware (control program) for controlling the apparatus 20 to the ROM 13 (step S302). Here, a jig connected to a universal serial bus (USB) port of the apparatus 20, for example, writes the control firmware to the ROM 13 of the circuit board 10. At this time, even if the apparatus 20 is not connected to a power supply, the jig can write the control firmware to the ROM 13 using power from the battery 17 on the substrate 11 or power thereof. Alternatively, the circuit board 10 may be connected to the jig by wire, and the jig may write the control firmware to the ROM 13 using the power thereof.

Lastly, the apparatus 20 is subjected to pre-shipment inspection (step S303). The pre-shipment inspection is performed to determine whether the components and functions of the apparatus 20 operate normally. Here, for example, whether there is a problem in a panel user interface (UI), scanning hardware, or the like is checked. The pre-shipment inspection of the apparatus 20 is performed by activating the apparatus 20 in a diagnosis mode using a diagnostic program included in the control firmware and giving a diagnosis through an operation using the panel UI.

After the pre-shipment inspection, the apparatus 20 is disconnected from the certain jig and packed up for shipment. The firmware might be updated while a power supply is not connected to the apparatus 20. For example, a firmware developer might address a problem or upgrade the firmware in order to add a new function to the apparatus 20 or improve an existing function. If the firmware is to be updated (YES in step S304), the firmware updating apparatus 60 transmits a firmware update program using the LPWA technique. The LPWA reception unit 15 of the circuit board 10 incorporated into the apparatus 20 receives the firmware update program, and the substrate 11 operates on the basis of the firmware writing firmware to update the firmware in the ROM 13 (step S305). Since the apparatus 20 has been disconnected from the apparatus 20, the battery 17 supplies power used for the updating to the CPU 12, the ROM 13, and the LPWA reception unit 15. The LPWA reception unit 15 may thus receive the firmware update program without a power supply of the apparatus 20 even after the circuit board 10 is incorporated into the apparatus 20. The firmware to be updated may be the control firmware or a function program for achieving other functions.

As illustrated in FIG. 9, as a result of the writing in step S302, the control firmware is written to the ROM 13. In FIG. 9, a function program other than the inspection program may remain in the ROM 13. In this case, the function program may be written to the ROM 13 in step S201, S203, S302, S305, or the like.

As described above, a dedicated hardware circuit can achieve the writing and updating of the firmware. At this time, only one piece of hardware or a plurality of pieces of hardware may be used.

The programs for writing and updating the firmware may be provided in a computer readable medium such as a USB memory, a flexible disk, or a compact disc read-only memory (CD-ROM), or may be provided online through a network such as the Internet. In this case, the programs stored in the computer readable medium are usually transferred to and stored in a memory, a storage, or the like.

The foregoing description of the exemplary embodiment of the present disclosure has been provided for the purposes of illustration and description. It is not intended to be exhaustive or to limit the disclosure to the precise forms disclosed. Obviously, many modifications and variations will be apparent to practitioners skilled in the art. The embodiment was chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A circuit board incorporable into an apparatus, the circuit board comprising:
   a substrate;
   a reception unit that is provided on the substrate and that wirelessly receives a function program for achieving a function;
   a storage unit that is provided on the substrate and to which a writing program for writing the function program received by the reception unit has been written in advance;
   a power supply provided on the substrate; and
   a power control unit that supplies power for receiving, with the reception unit, the function program and power for writing, on a basis of the writing program, the function program to the storage unit using the power supply without using an external power supply.

2. The circuit board according to claim 1,
   wherein the writing program is written to the storage unit before the circuit board is incorporated into the apparatus.

3. The circuit board according to claim 1,
   wherein a shipment inspection program for performing shipment inspection is received by the reception unit and stored in the storage unit as the function program, and
   wherein the circuit board is subjected to the shipment inspection based on the shipment inspection program.

4. The circuit board according to claim 3,
   wherein the shipment inspection program is deleted from the storage unit after the shipment inspection is performed.

5. The circuit board according to claim 1,
   wherein the reception unit receives, as the function program, a control program writing program for writing a control program for controlling the apparatus to the storage unit, an amount of data of the control program writing program being larger than an amount of data of the function program.

6. The circuit board according to claim 5,
   wherein the control program is received through a certain jig without using the reception unit and written to the storage unit on a basis of the control program writing program.

7. The circuit board according to claim 1,
   wherein the reception unit receives the function program using a low-power wide-area communication technique.

8. The circuit board according to claim 7,
   wherein the reception unit receives the function program simultaneously as a reception unit of another circuit board.

9. The circuit board according to claim 1,
   wherein the reception unit is capable of receiving an update program for updating the function program without using a power supply of the apparatus even after the circuit board is incorporated into the apparatus.

10. A method for delivering a program to a plurality of circuit boards, each of which includes a reception unit that wirelessly receives a function program for achieving a function and a storage unit to which a writing program for writing the function program received by the reception unit has been written in advance, the method comprising:
    simultaneously transmitting the same function program to the plurality of reception units included in the plurality of circuit boards.

11. A circuit board incorporable into an apparatus, the circuit board comprising:
    substrate means;
    reception means for wirelessly receiving a function program for achieving a function, the reception means being provided on the substrate means;
    storage means that is provided on the substrate means and to which a writing program for writing the function program received by the reception means has been written in advance;
    power supply means provided on the substrate means; and
    power control means for supplying power for receiving, with the reception means, the function program and power for writing, on a basis of the writing program, the function program to the storage means using the power supply without using an external power supply.

* * * * *